US008871611B2

(12) United States Patent
Broekaart (10) Patent No.: US 8,871,611 B2
(45) Date of Patent: *Oct. 28, 2014

(54) METHOD FOR MOLECULAR ADHESION BONDING AT LOW PRESSURE

(71) Applicant: Soitec, Bernin (FR)

(72) Inventor: Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/067,453

(22) Filed: Oct. 30, 2013

(65) Prior Publication Data

US 2014/0065759 A1    Mar. 6, 2014

Related U.S. Application Data

(60) Division of application No. 13/718,624, filed on Dec. 18, 2012, now abandoned, which is a division of application No. 13/192,312, filed on Jul. 27, 2011, now Pat. No. 8,338,266, which is a continuation-in-part of application No. 12/910,081, filed on Oct. 22, 2010, now abandoned.

(30) Foreign Application Priority Data

Aug. 11, 2010  (FR) .................................... 10 56566

(51) Int. Cl.
  H01L 21/30      (2006.01)
  H01L 21/46      (2006.01)
  H01L 21/762     (2006.01)
  H01L 27/146     (2006.01)
  H01L 27/14      (2006.01)
  H01L 21/67      (2006.01)
  H01L 21/20      (2006.01)
  H01L 23/544     (2006.01)
  H01L 23/00      (2006.01)

(52) U.S. Cl.
CPC ... *H01L 21/76251* (2013.01); *H01L 2224/8313* (2013.01); *H01L 2223/54493* (2013.01); *H01L 2223/54426* (2013.01); *H01L 24/83* (2013.01); *H01L 27/14687* (2013.01); *H01L 2224/83894* (2013.01); *H01L 27/14* (2013.01); *H01L 21/67092* (2013.01); *H01L 2223/54453* (2013.01); *H01L 21/2003* (2013.01); *H01L 23/544* (2013.01)
USPC ........................................... 438/459; 438/455

(58) Field of Classification Search
USPC .................... 438/73, 459, 455; 257/E21.214, 257/E31.032; 977/840
See application file for complete search history.

(56) References Cited

U.S. PATENT DOCUMENTS

| 5,223,001 A | 6/1993 | Saeki ........................... 29/25.01 |
| 5,537,884 A | 7/1996 | Nishimura et al. ............. 73/842 |

(Continued)

FOREIGN PATENT DOCUMENTS

| EP | 0 366 208 A2 | 5/1990 |
| EP | 0 444 942 B1 | 9/1991 |

(Continued)

OTHER PUBLICATIONS

Preliminary Search Report and Written Opinion (with English translation), application No. FR 1056719, dated Apr. 12, 2011.

(Continued)

*Primary Examiner* — Khiem D Nguyen
*Assistant Examiner* — Wilner Jean Baptiste
(74) *Attorney, Agent, or Firm* — TraskBritt (57) ABSTRACT

A method for bonding first and second wafers by molecular adhesion. The method includes placing the wafers in an environment having a first pressure (P1) greater than a predetermined threshold pressure above which initiation of bonding wave propagation is prevented, bringing the first wafer and the second wafer into alignment and contact, and spontaneously initiating the propagation of a bonding wave between the wafers after they are in contact solely by reducing the pressure within the environment to a second pressure (P2) below the threshold pressure.

14 Claims, 7 Drawing Sheets

(56) References Cited

U.S. PATENT DOCUMENTS

| | | | |
|---|---|---|---|
| 5,696,327 A | 12/1997 | Huang et al. ............... | 73/845 |
| 5,769,991 A | 6/1998 | Miyazawa et al. ........... | 156/153 |
| 5,834,812 A | 11/1998 | Golland et al. ............... | 257/347 |
| 5,937,312 A | 8/1999 | Iyer et al. ..................... | 438/459 |
| 6,008,113 A | 12/1999 | Ismail et al. .................. | 438/615 |
| 6,010,591 A | 1/2000 | Gosele .......................... | 156/281 |
| 6,113,721 A | 9/2000 | Secco d'Aragona et al. . | 156/154 |
| 6,117,695 A | 9/2000 | Murphy et al. ................ | 438/15 |
| 6,180,496 B1 | 1/2001 | Farrens et al. ................ | 438/455 |
| 6,207,005 B1 | 3/2001 | Henley et al. ................ | 156/345 |
| 6,221,774 B1 | 4/2001 | Malik ............................ | 438/690 |
| 6,387,815 B2 | 5/2002 | Sakamoto ...................... | 438/709 |
| 6,523,419 B1 | 2/2003 | Nonaka et al. ................ | 73/827 |
| 6,616,332 B1 | 9/2003 | Renken et al. ................ | 374/162 |
| 6,645,828 B1 | 11/2003 | Farrens et al. ................ | 438/455 |
| 6,908,832 B2 | 6/2005 | Farrens et al. ................ | 438/455 |
| 7,250,368 B2 | 7/2007 | Kida et al. .................... | 438/690 |
| 7,727,860 B2 | 6/2010 | Miyazaki et al. ............. | 438/459 |
| 8,338,266 B2 * | 12/2012 | Broekaart ...................... | 438/455 |
| 2001/0055863 A1 | 12/2001 | Nakano et al. ................ | 438/549 |
| 2002/0187595 A1 | 12/2002 | Walitzki et al. ............... | 438/184 |
| 2003/0079828 A1 | 5/2003 | Kassir et al. .................. | 156/230 |
| 2003/0168145 A1 | 9/2003 | Suga et al. .................... | 156/60 |
| 2004/0085858 A1 | 5/2004 | Khuri-Yakub et al. ....... | 367/181 |
| 2004/0121556 A1 | 6/2004 | Kim et al. ..................... | 438/455 |
| 2004/0224480 A1* | 11/2004 | Forbes .......................... | 438/455 |
| 2004/0229444 A1 | 11/2004 | Couillard et al. ............. | 438/455 |
| 2004/0246795 A1 | 12/2004 | Tomita .......................... | 365/200 |
| 2005/0081958 A1 | 4/2005 | Adachi et al. ................ | 148/33.1 |
| 2005/0152089 A1 | 7/2005 | Matsuda et al. .............. | 361/234 |
| 2006/0055003 A1 | 3/2006 | Tomita et al. ................ | 257/629 |
| 2007/0039395 A1 | 2/2007 | Gupta et al. .................. | 73/800 |
| 2007/0072393 A1 | 3/2007 | Aspar et al. .................. | 438/459 |
| 2007/0117229 A1 | 5/2007 | Schwarzenbach et al. ..... | 438/14 |
| 2007/0158831 A1 | 7/2007 | Cha et al. ..................... | 257/724 |
| 2007/0237448 A1 | 10/2007 | Sato et al. ..................... | 385/13 |
| 2008/0044984 A1 | 2/2008 | Hsieh et al. ................... | 438/459 |
| 2008/0053619 A1 | 3/2008 | Nakayama et al. ........... | 156/382 |
| 2008/0128621 A1 | 6/2008 | Berry ........................... | 250/338.1 |
| 2008/0128898 A1 | 6/2008 | Henderson et al. ........... | 257/713 |
| 2008/0200008 A1 | 8/2008 | Kerdiles et al. ............... | 438/455 |
| 2009/0023271 A1 | 1/2009 | Couillard et al. ............. | 438/458 |
| 2009/0042363 A1 | 2/2009 | Miyazaki et al. ............. | 438/459 |
| 2009/0111245 A1 | 4/2009 | Okabe et al. .................. | 438/459 |
| 2009/0280595 A1 | 11/2009 | Broekaart et al. ............ | 438/456 |
| 2010/0122762 A1 | 5/2010 | George ......................... | 156/64 |
| 2010/0155882 A1 | 6/2010 | Castex .......................... | 257/507 |
| 2011/0045611 A1 | 2/2011 | Castex et al. ................. | 438/5 |
| 2011/0097874 A1 | 4/2011 | Broekaart et al. ............ | 438/459 |
| 2011/0308721 A1 | 12/2011 | Broekaart et al. ............ | 156/285 |
| 2012/0048007 A1 | 3/2012 | Landru ......................... | 73/150 A |

FOREIGN PATENT DOCUMENTS

| | | |
|---|---|---|
| EP | 0 451 993 A2 | 10/1991 |
| EP | 0 854 500 B1 | 7/1998 |
| EP | 0 860 862 B1 | 8/1998 |
| EP | 0 865 073 A2 | 9/1998 |
| EP | 0 886 306 A1 | 12/1998 |
| EP | 0 935 280 B1 | 8/1999 |
| EP | 0 964 436 A2 | 12/1999 |
| EP | 1 189 266 A1 | 3/2002 |
| EP | 1 662 549 A1 | 5/2006 |
| EP | 1 887 613 A1 | 2/2008 |
| EP | 1 998 368 A2 | 12/2008 |
| EP | 2 200 077 A1 | 6/2010 |
| FR | 2 935 535 A1 | 3/2010 |
| JP | 3089519 A | 4/1991 |
| JP | 4263425 A | 9/1992 |
| JP | 7045485 A | 2/1995 |
| JP | 9017984 A | 1/1997 |
| JP | 11017701 A | 1/1999 |
| JP | 11067701 A | 3/1999 |
| JP | 11354761 A | 12/1999 |
| JP | 2001144274 A | 5/2001 |
| WO | WO 99/60607 A2 | 11/1999 |
| WO | WO 03/008938 A2 | 1/2003 |
| WO | WO 03/019157 A1 | 3/2003 |
| WO | WO 2006/038030 A2 | 4/2006 |
| WO | WO 2009/135800 A2 | 11/2009 |

OTHER PUBLICATIONS

Preliminary Search Report, application No. FR 1002618, dated Jan. 25, 2011.

International Search Report, application No. PCT/EP2009/059961, mailed Oct. 5, 2009.

European Search Report, application No. EP 08291226, dated Jul. 7, 2009.

Burns et al., "A Wafer-Scale 3-D Circuit Integration Technology," IEEE Transactions on Electron Devices, 53(10):2507-2516 (2006).

Esser et al., "Improved Low-Temperature Si—Si Hydrophilic Wafer Bonding," Journal of the Electrochemical Society, 150(3):G228-G231 (2003).

Gösele et al., "Self-propagating room-temperature silicon wafer bonding in ultrahigh vacuum," Applied Phys. Lett., 67(24):3614-3615 (Dec. 1995).

Horie et al., "Advanced SOI Devices Using CMP and Wafer Bonding," Extended Abstracts of the International Conference on Solid State Devices and Materials, Japan Society of Applied Physics, Tokyo, Japan, pp. 473-475 (1996).

Kim-Lee et al., "Capillary Assisted Alignment for High Density Wafer-Level Integration," Computational Mechanics Center, University of Wisconsin—Madison, Conference of Wafer Bonding for MEMS and Wafer-Level Integration, Slides 1-26 (Dec. 10, 2007).

Maszara, et al., "Bonding of silicon wafers for silicon-on-insulator," J. Appl. Phys., 64(10):4943-4950 (Nov. 1988).

Plößl et al., "Covalent Silicon Bonding at Room Temperature in Ultra High Vacuum," Mat. Res. Soc. Symp. Proc., 483:141-146 (1998).

Steen et al., "Overlay as the key to drive wafer scale 3D integration," Microelectronic Engineering, 84:1412-1415 (2007).

Takagi et al., "Room Temperature Silicon Wafer Direct Bonding in Vacuum by Ar Beam Irradiation," Micro Electro Mechanical Systems, 1997, MEMS '97, Proceedings, IEEE, Tenth Annual International Workshop on Jan. 26-30, 1997, Nagoya, Japan, pp. 191-196. Online search, URL: http://ieeexplore.ieee.org/stamp/stamp.jsp?tp=&arnumber=581801.

Takagi et al, "Wafer-scale spontaneous bonding of silicon wafers by argon-beam surface activation at room temperature," Sensors and Actuators A, 105:98-102 (2003).

Topol et al., "3D Fabrication Options for High-Performance CMOS Technology," Wafer Level 3 ICs Process Technology, Tan, Gutmann, Reif Eds., pp. 197-217 (2008).

Turner et al., "Predicting distortions and overlay errors due to wafer deformation during chucking on lithography scanners," J. Micro/Nanolith. MEMS MOEMS, 8(4):043015-1-043015-8 (Oct.-Dec. 2009).

Turner et al., "Modeling of direct wafer bonding: Effect of wafer bow and etch patterns," Journal of Applied Physics, 92(12):7658-7666 (Dec. 15, 2002).

Turner et al., "Mechanics of wafer bonding: Effect of clamping," Journal of Applied Physics, 95(1):349-355 (Jan. 1, 2004).

* cited by examiner

METHOD FOR MOLECULAR ADHESION BONDING AT LOW PRESSURE

CROSS-REFERENCE TO RELATED APPLICATIONS

This application is a divisional of U.S. application Ser. No. 13/718,624 filed on Dec. 18, 2012, which is a divisional of U.S. application Ser. No. 13/192,312 filed on Jul. 27, 2011, now U.S. Pat. No. 8,338,266, which in turn is a continuation-in-part of U.S. application Ser. No. 12/910,081 filed on Oct. 22, 2010, now abandoned, which claims priority to French Application No. 10-56566 filed on Aug. 11, 2010, the content of each if which is expressly incorporated herein by reference thereto.

FIELD OF THE INVENTION

The present invention relates to a molecular adhesion bonding carried out at low pressure (also referred to as LPB for "Low Pressure Bonding") between two "wafers."

BACKGROUND OF THE INVENTION

In order to obtain a high bonding energy and limit the weakly bonded or non-bonded zones at the periphery of the wafers, it is known to carry out molecular adhesion bonding between two wafers under a reduced pressure or partial vacuum, as described particularly in document EP 2 200 077 A1. During molecular adhesion bonding at low pressure, the force necessary for initiating the propagation of a bonding wave between two wafers is less than that required at ambient pressure. Furthermore, the lower the pressure, the more rapidly the bonding wave propagates between the wafers.

The quality of a structure obtained by low pressure bonding between two wafers, however, is variable. In fact, the Applicant has observed that bonding carried out between two wafers by molecular adhesion at low pressure, typically at a pressure less than or equal to 1 millibar, is equally likely to give very satisfactory results and poor results in terms of deformations of the wafers, even for wafers coming from the same batch. This lack of a reproducible nature of the results after bonding is due to the fact that the propagation of the bonding wave may be initiated during the operations of alignment and progressive contacting of the wafers before carrying out the bonding per se, owing to the low pressure environment in which the wafers are placed and which promotes such initiation.

When the propagation of a bonding wave is initiated during these prior steps of handling the wafers, inhomogeneous deformations can occur on one or both wafers.

These deformations are problematic because they are not controllable and irreversible.

A particular case in which the occurrence of these inhomogeneous deformations is problematic is that of multilayer semiconductor structures (also referred to as "multilayer semiconductor wafers") produced according to the technology of three-dimensional integration (3D integration) which involves the transfer onto a first wafer, referred to as the final substrate, of at least one layer formed from a second wafer, which is bonded by molecular adhesion onto the first wafer and is generally thinned after bonding, this layer corresponding to the portion of the second wafer in which elements have been formed, for example a plurality of microcomponents. Other corresponding elements may optionally also be formed in the first wafer.

In the case of a first wafer intended to carry microcomponents, in particular because of the very small size or large number of the microcomponents present on a given layer, each transferred layer, that is to say each wafer comprising the layer, must be positioned on the final substrate (the first wafer on its own or already comprising other transferred layers) with a correct precision in order to comply with alignment with the underlying layer, of the order of 0.3 microns. It may furthermore be necessary to carry out treatments on the layer after its transfer, for example in order to form other microcomponents, in order to uncover microcomponents on the surface, in order to produce interconnects, etc., these treatment operations also having to be carried out with very great precision in relation to the components present in the layer.

Although molecular adhesion bonding at low pressure makes it possible to obtain a high bonding energy without having to carry out an anneal for reinforcing the bonding interface at high temperature, which could damage the microcomponents, the inhomogeneous deformations generated in the wafers as explained above may make it very difficult or even impossible to form additional microcomponents in alignment with the microcomponents formed before the transfer. This type of problem of inhomogeneous deformations of the bonded wafers exists even outside the scope of 3D integration, that is to say in the case in which the first wafer does not comprise microcomponents or is not intended to carry them later.

In the particular case of 3D integration, the inhomogeneous deformations resulting from the low pressure molecular bonding subsequently lead to a phenomenon of misalignment of the microcomponents of the various layers. This misalignment phenomenon also referred to as "overlay," described with reference to FIG. 5, is manifested in the form of defects of the order of 50 nm, much less than the alignment precision of the substrates at the moment of molecular bonding.

Figure 5:
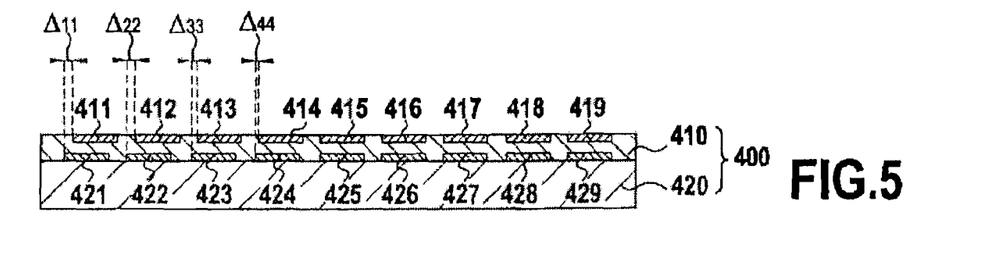
FIG. 5 is a schematic view showing a three-dimensional structure after molecular adhesion bonding at low pressure according to the prior art.

FIG. 5 illustrates a three-dimensional structure 400 obtained by molecular adhesion bonding at low pressure between a first wafer or initial substrate 410, on which a first series of microcomponents 411 to 419 is formed by photolithography by means of a mask making it possible to define the regions for formation of the patterns corresponding to the microcomponents to be produced, and a second wafer or final substrate 420. The initial substrate 410 has been thinned after bonding in order to remove a portion of material present above the layer of microcomponents 411 to 419, and a second layer of microcomponents 421 to 429 has been formed level with the exposed surface of the initial substrate 410.

Even when using positioning tools, however, offsets occur between certain of the microcomponents 411 to 419 on the one hand, and 421 to 429 on the other hand, such as the offsets $\Delta 11$, $\Delta 22$, $\Delta 33$, $\Delta 44$ indicated in FIG. 5 (respectively corresponding to the offsets observed between the pairs of microcomponents 411/421, 412/422, 413/423 and 414/424).

These offsets do not result from elementary transformations (translation, rotation or combinations thereof) which could have resulted from imprecise assembly of the substrates. These offsets result from inhomogeneous deformations which occur in the layer coming from the initial substrate during its bonding to the final substrate. Specifically, these deformations lead to nonuniform local displacements level with certain microcomponents 411 to 419. Also, certain of the microcomponents 421 to 429 formed on the exposed surface of the substrate after transfer exhibit position variations with respect to these microcomponents 411 to 419, which may be of the order of several hundreds of nanometers, or even one micron.

This phenomenon of misalignment (also referred to as "overlay") between the two layers of microcomponents may give rise to short circuits, distortions in the stack or connection defects between the microcomponents of the two layers. Thus, in the case in which the transferred microcomponents are imagers formed by pixels and the post-transfer treatment steps are intended to form color filters on each of these pixels, a loss of the coloration function is observed for some of these pixels.

This misalignment phenomenon also leads to a reduction of the quality and the value of the multilayer semiconductor wafers being fabricated. The impact of this phenomenon is becoming more and more critical because of the incessantly increasing requirements in respect of the miniaturization of the microcomponents and their integration density per layer.

SUMMARY OF THE INVENTION

The present invention relates to a method for bonding at least a first wafer and a second wafer by molecular adhesion. This method comprises providing a first wafer, providing a second wafer, wherein the first wafer may be a silicon-on-insulator (SOI) type structure or substrate, placing the first wafer and the second wafer in an environment having a first pressure (P1) greater than a predetermined threshold pressure, aligning the first wafer and the second wafer, bringing the first wafer and the second wafer into contact, reducing the pressure within the environment to a second pressure (P2) below the threshold pressure, and initiating the propagation of a bonding wave between the first and second wafer, wherein propagation of the bonding wave is initiated by applying a mechanical pressure point to one of the two wafers, wherein the pressure applied by the mechanical pressure point onto one of the two wafers lies between 1 MPa and 33.3 MPa. The initiation may be carried out using a tool equipped with a stylet, and the mechanical pressure exerted by the stylet onto the wafer may be controlled in order to limit the deformations at the level of the contact point. The bonding wave may be initiated by applying a mechanical pressure Pm onto the substrate in proximity to its edge. The first pressure (P1) is greater than a predetermined threshold pressure, wherein the predetermined threshold value is between 20 millibar and 5 millibar. The first pressure (P1) may be at or above a pressure of about 400 millibar.

The pressure in the environment is reduce to a second pressure (P2) of less than 1 mbar, so as to spontaneously initiate the bonding wave.

The method further comprises arranging the first wafer and the second wafer such that the surfaces to be brought into contact are facing one another, while interposing spacer elements to maintain a space between the two wafers, and wherein the wafers are aligned by applying a lateral force to the wafers. There are at least three spacer elements interposed between the two wafers to maintain the space between the wafers, and the lateral force is applied to the wafers by a pusher that can move from a retracted position to an alignment position, wherein a head of the pusher abuts the edges of the wafers.

The method further comprises retracting one of the spacer elements, such that the second wafer descends onto the first wafer, applying a first lateral force by a pusher onto the wafers so as to align the two wafers with respect to one another, wherein the wafers are retained by at least one holding finger, retracting the second and third spacer elements, retracting the pusher to thereby allow the lower face of the second wafer to rest on the upper face of the first wafer, applying a second lateral force by the pusher to the two wafers, and retracting the pusher before initiating the propagation of the bonding wave.

The first wafer and the second wafer have alignment marks that interact with a holding finger, and further wherein the force exerted by the pusher places the wafers in abutment against at least the holding finger interacting with the alignment marks.

According to an aspect of the invention, during the initiation of a propagation bonding wave, the wafers are placed in an environment at a second pressure of less than 1 mbar, so as to spontaneously initiate the bonding wave.

According to another aspect of the invention, the initiation of a propagation bonding wave comprises the application of a mechanical pressure point on one of the two wafers.

The present invention also relates to a method for producing a three-dimensional composite structure comprising providing a first wafer, wherein there is a first layer of microcomponents on one face of the first wafer, providing a second wafer, placing the first wafer with microcomponents thereon and the second wafer in an environment having a first pressure (P1) greater than a predetermined threshold pressure, aligning the first wafer and the second wafer, bringing the face of the first wafer comprising the layer of microcomponents into contact with the face of the second wafer, reducing the pressure within the environment to a second pressure (P2) below the threshold pressure, and initiating the propagation of a bonding wave between the first and second wafer.

In another embodiment, the method may further comprise forming an oxide layer on the face of the first wafer covering the first layer of microcomponents prior to bonding the first and second wafers. The method may also comprise thinning the first wafer, and/or producing a second layer of microcomponents on the face of the first wafer opposite the face having the first layer of microcomponents, wherein at least the first layer of microcomponents on the first wafer may be image sensors.

The present method makes it possible to limit the inhomogeneous deformations which occur in a wafer or a substrate during its bonding by molecular adhesion onto another wafer or substrate, while preserving the advantages of low pressure bonding.

The present invention further still relates to a three-dimensional composite structure comprising a wafer and a layer of semiconductor crystalline material bonded on the wafer by molecular adhesion. The layer has a first face located in the vicinity of the bonding interface between the layer and the wafer and a second face opposite to the first face. The layer of semiconductor crystalline material includes a first series of microcomponents on its first face and a second series of microcomponents on its second face in alignment with the first series of microcomponents.

Advantageously, the residual alignment offsets between the first series of microcomponents and the second series of microcomponents are less than 100 nm homogeneously over the entire surface of the structure. With such a limited residual alignment, the occurrence of manufacturing defects such as short circuits, distortions or connection defects between the microcomponents of the two series of microcomponents is considerably reduced. In the case in which the first series of microcomponents comprises imagers formed by pixels while the second series of microcomponents comprises color filters intended to be aligned with each pixel, the coloration function can be ensured for all pixels.

According to another aspect of the invention, the residual alignment offsets between the first series of microcomponents and the second series of microcomponents are less than 50 nm over at least 50% of the surface of the structure.

These advantages are preferably provided in a composite structure that has a diameter of 300 mm or more, and at least some of the microcomponents are image sensor.

BRIEF DESCRIPTION OF THE DRAWINGS

Other characteristics and advantages of the invention will become apparent from the following description of particular embodiments of the invention, given by way of nonlimiting examples, with reference to the appended drawings in which.

DETAILED DESCRIPTION OF THE INVENTION

The present invention relates to a method for molecular adhesion bonding between at least a first wafer and a second wafer comprising at least a step of mechanical alignment, a step of bringing the two wafers in contact and a step of initiating the propagation of a bonding wave between the two wafers, in which method, during the said steps of mechanical alignment and bringing the two wafers in contact, the wafers are placed in an environment at a first pressure greater than or equal to a predetermined pressure threshold value, and during the step of initiating the propagation of a bonding wave, the wafers are placed in an environment at a second pressure less than the predetermined pressure threshold value.

The present invention applies in general to the production of composite structures comprising at least the molecular adhesion bonding of a first substrate or wafer onto a second substrate or wafer.

Molecular adhesion bonding is a technique well known in the art. The principle of molecular adhesion bonding is based on bringing two surfaces in direct contact, (i.e.: without using a specific material such as adhesive, wax, braze, etc.). Such an operation requires that the surfaces to be bonded are sufficiently smooth, and free of particles or contamination, and that they are brought sufficiently close together in order to make it possible to initiate contact, typically at a distance of less than a few nanometers. In this case, the attractive forces between the two surfaces are high enough to cause the propagation of a bonding wave which leads to molecular adhesion (bonding induced by all the attractive forces (Van Der Waals forces) of electronic interaction between atoms or molecules of the two surfaces to be bonded).

The molecular adhesion is achieved by initiating at least one contact point on one wafer in intimate contact with another wafer in order to trigger the propagation of a bonding wave from this contact point. Here, a "bonding wave" refers to the front of connection or molecular adhesion which propagates from the initiation point and which corresponds to the spreading of the attractive forces (Van Der Waals forces) from the contact point over the entire surface of intimate contact between the two wafers (bonding interface). The contact point is typically initiated by applying a mechanical pressure onto the exposed surface of one of the two wafers. This contact point may nevertheless be generated spontaneously by subjecting the two wafers in contact to a very low pressure, typically less than 5 millibar (mbar) and/or by the action of the force of gravity of one wafer on the other.

Although molecular adhesion bonding at low pressure makes it possible to improve the quality of the bonding, the Applicant has observed that if the bonding, and more precisely the propagation of a bonding wave, is initiated during the phase of mechanical alignment and bringing the wafers in contact, inhomogeneous deformations can be produced in the wafers.

To this end, the invention proposes to carry out the operations of mechanical alignment and bringing the wafers in contact by placing them in an environment having a pressure greater than a predetermined pressure threshold value below which there are risks of initiating the propagation of a bonding wave between the two wafers during their handling.

The term "ambient pressure" is intended to mean the pressure naturally prevailing in the bonding chamber, which is to say without using a pumping means, this pressure corresponding to the atmospheric pressure of the environment in which the bonding machine is located. The pressure threshold value is less than atmospheric pressure.

Once these operations have been carried out, the pressure of the chamber can be reduced below the defined pressure threshold value in order to allow the initiation of the propagation of a bonding wave between the two wafers. In particular, the propagation of a bonding wave between the wafers is spontaneously initiated after the wafers are placed in contact solely by reducing the pressure within the environment to a pressure (P2) that is below the threshold pressure.

An example of molecular adhesion bonding between two wafers according to an embodiment of the method of the invention will now be described with reference to FIGS. 1 and 2A to 2I.

Figure 1:
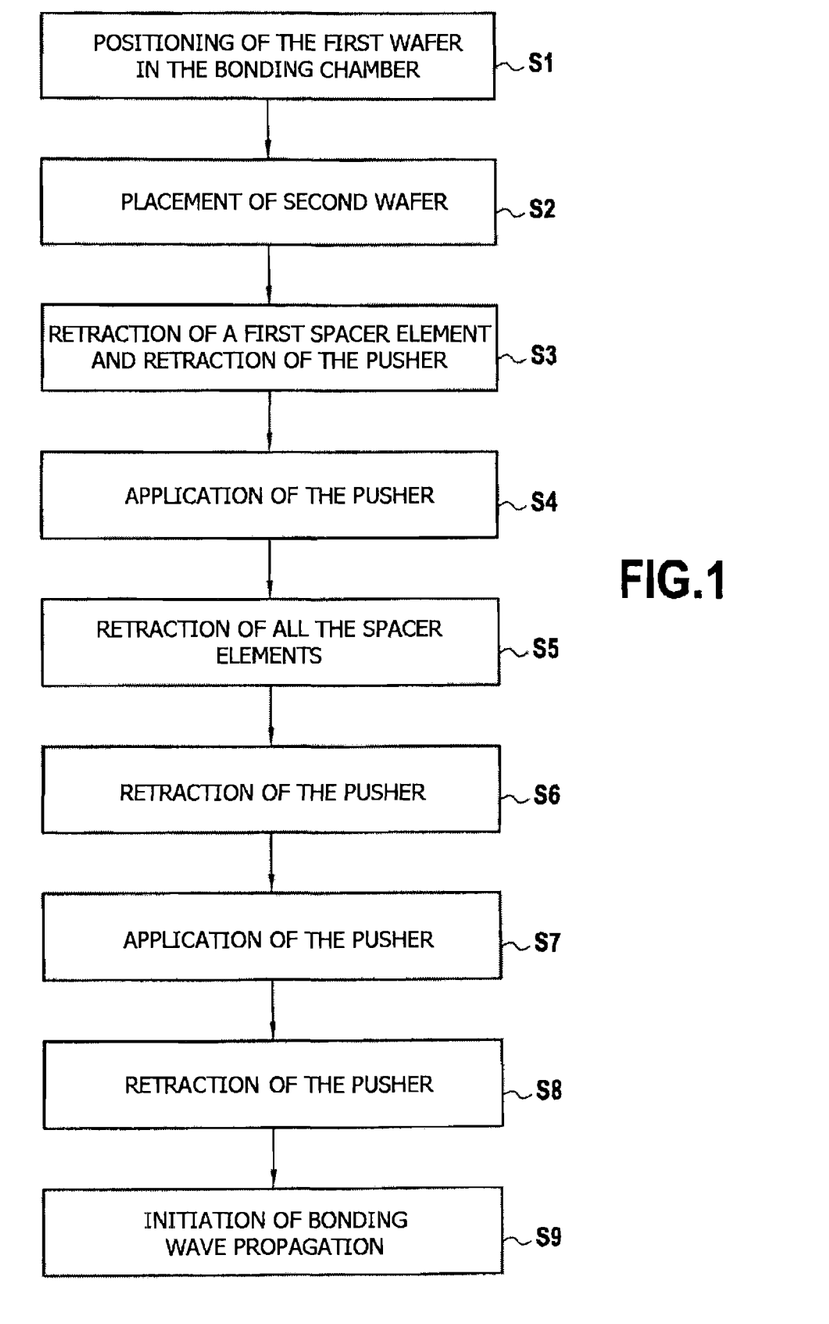
FIG. 1 is a flow chart of the steps of a molecular adhesion bonding method of the invention illustrated in FIGS. 2A to 2I, FIGS. 2A to 2I are schematic views of a molecular adhesion bonding method according to an embodiment of the invention.
Figure 2A:
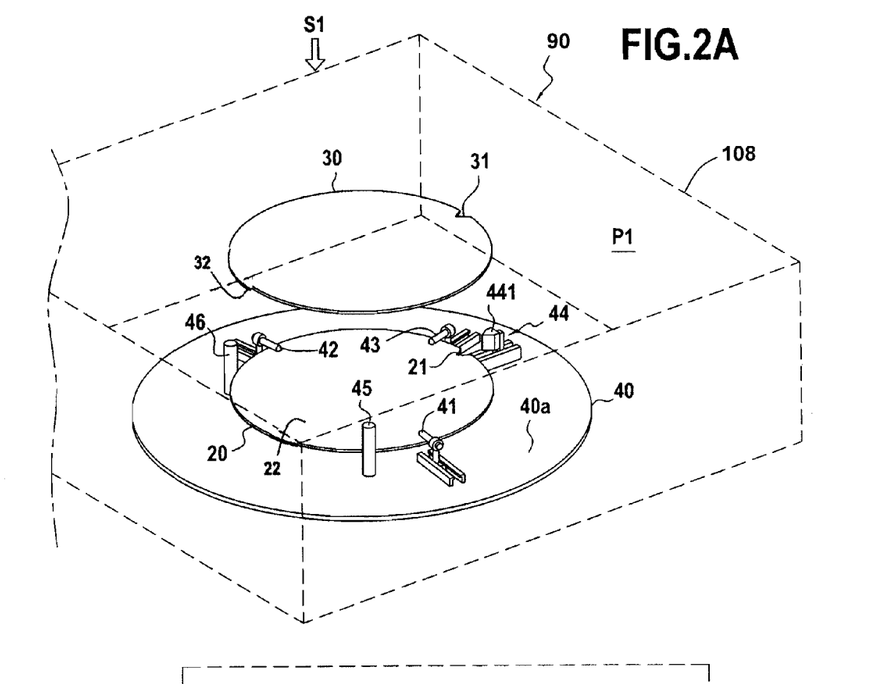

In FIG. 2A, a first wafer or substrate 20 is placed in a chamber 108 of a bonding machine 90, the chamber comprising a substrate holder device 40 (Step S1). The substrate holder device 40 comprises a support plate 40a which has planarity defects preferably less than 15 microns. The support plate 40a holds the first wafer 20, for example by means of an electrostatic or suction system associated with the support plate 40a or by simple gravity, with a view to assembling it by molecular adhesion with a second wafer or substrate 30. The associated systems for holding the wafer (electrostatic or by suction) are used in so far as it has been checked that they do not deform the wafer so as not to lead to an increase in the problems of misalignment ("overlay").

Figure 2B:
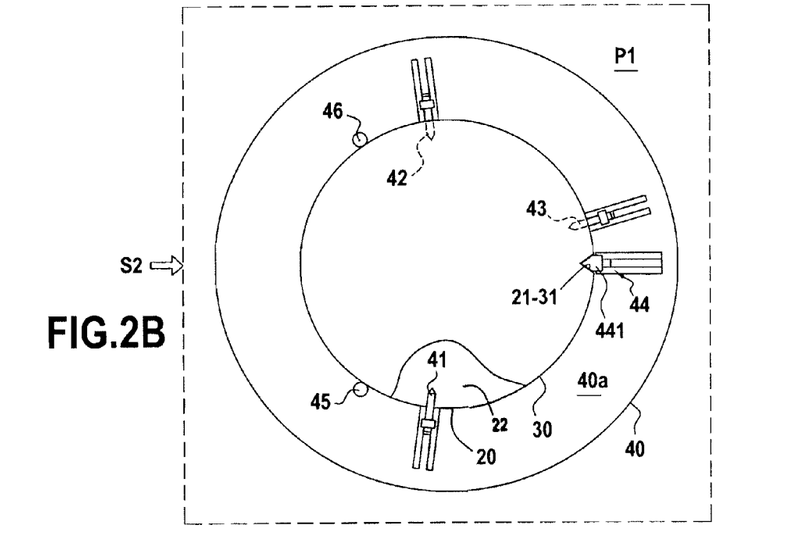
Figure 2C:
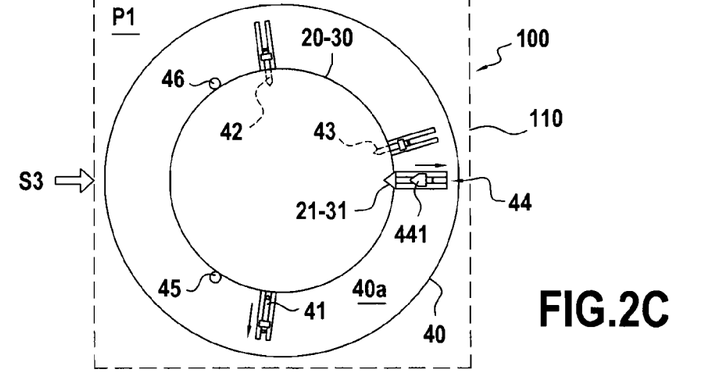

Once the wafer 20 is held on the support plate, three spacer elements 41 to 43 intended to temporarily prevent contact between the two wafers are put in position. The bonding machine furthermore comprises a pusher 44 which comprises a head 441. The pusher 44 is displaced between a retracted position in which the head 441 is at a distance from the edges of the wafers 20 and 30 and does not exert a force on the wafers (as illustrated in FIG. 2A), and a mechanical alignment position in which the head 441 abuts against the edges of the wafers 20 and 30 and exerts an alignment force, principally in the radial direction, on the two wafers which are retained on the opposite side by two holding fingers 45 and 46, the finger 45 being intended to interact with alignment marks made in the form of "notches" 21 and 31 respectively in the wafers 20 and 30 (as illustrated in FIG. 2B). In its alignment position, the head 441 of the pusher 44 exerts a thrust against the wafers allowing them to be placed in abutment against the holding fingers 45 and 46 and ensure their alignment.

The wafer 30 is then deposited on the spacer elements 41 to 43 so as to arrange the lower surface or face 32 of the wafer 30 facing the upper surface 22 of the wafer 20 (FIG. 2B, Step S2). At this moment, the pusher 44 is in its mechanical alignment position and exerts a holding force on the wafers against the fingers 45 and 46.

In a well-known fashion, the surfaces 22 and 32 respectively of the wafers 20 and 30 intended to be bonded have been prepared (polishing, cleaning, hydrophobic/hydrophilic treatment, etc.) in order to allow molecular adhesion.

During the subsequent operation, the spacer element 41 is retracted then the pusher 44 is placed in its retracted position (FIG. 2C, Step S3), which makes the portion of the wafer 30 present at the location of the spacer element 41 and of the holding finger 45 descend onto the wafer 20.

Figure 2D:
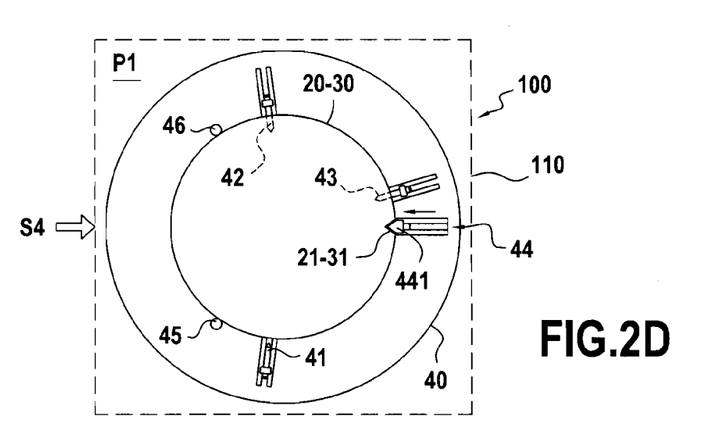
Figure 2E:
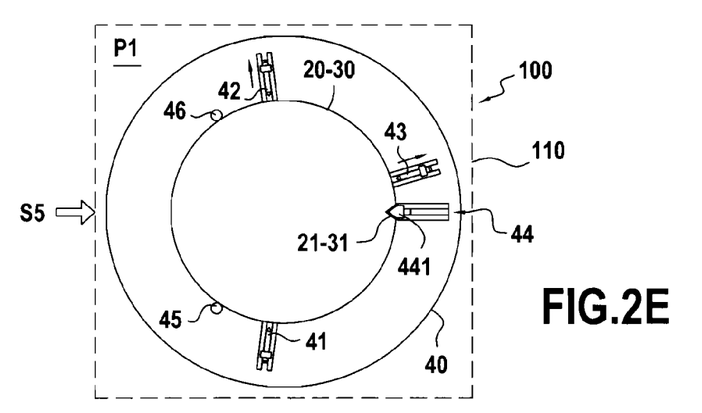
Figure 2F:
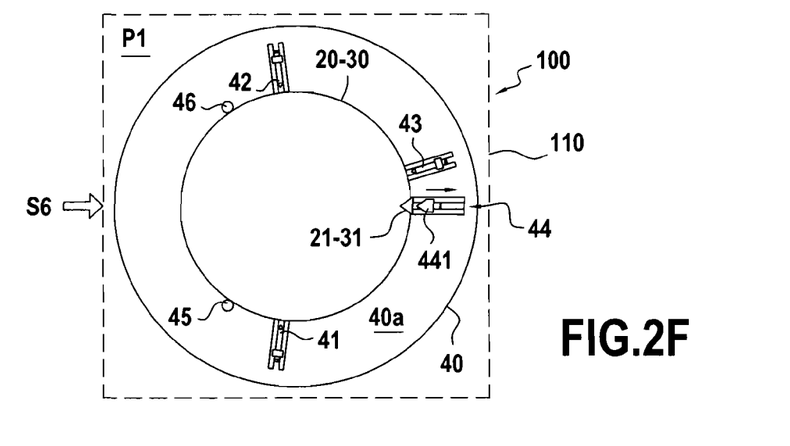

The pusher 44 is again placed in its alignment position in order to keep the wafers aligned (FIG. 2D, Step S4). The spacer elements still present between the two wafers, namely in this case the spacer elements 42 and 43, are retracted while the pusher 44 is still in its position holding the wafers in alignment (FIG. 2E, Step S5), at which moment the wafers 20 and 30 experience compressive stresses. The pusher 44 is then placed in its retracted position in order to relax the stresses applied to the wafers and in order to release the wafer 30 from being held against the fingers 45 and 46 and allow its lower face to rest entirely on the upper face of the wafer 20 (FIG. 2F, Step S6).

Figure 2G:
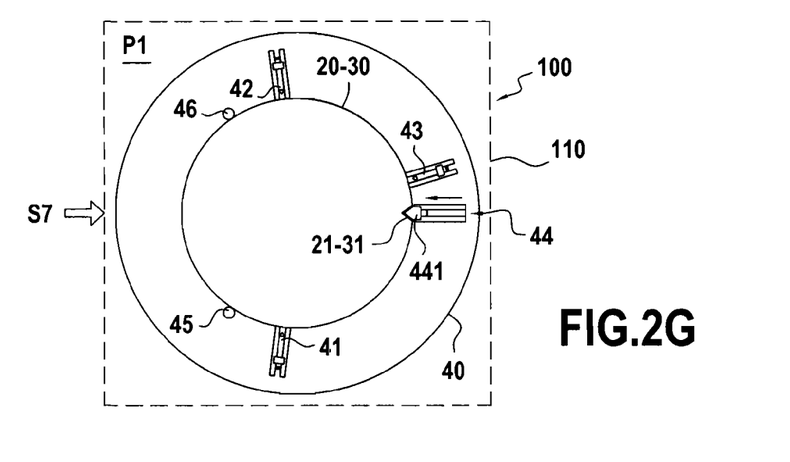
Figure 2H:
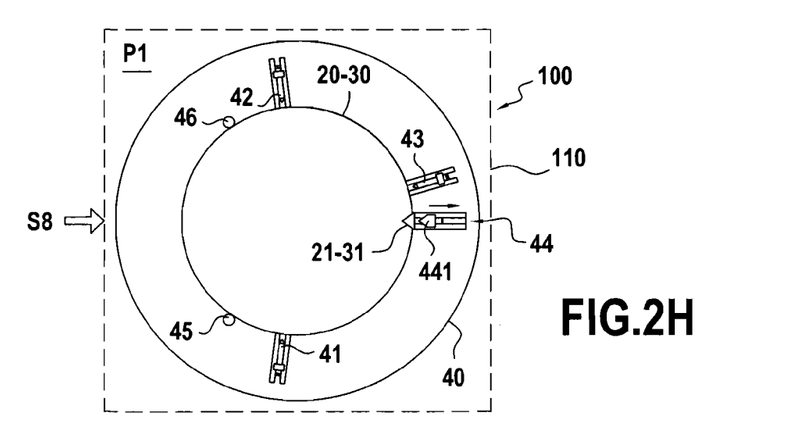

The pusher 44 is once more placed in its mechanical alignment position in order to ensure that the wafers 20 and 30 are properly aligned before initiation of the propagation of a bonding wave (FIG. 2G, Step S7). The pusher is then placed in its retracted position in order to relax the stresses applied onto the wafers 20 and 30 (FIG. 2H, Step S8).

According to the invention, the steps S1 to S8, are carried out while placing the wafers in an environment at a first pressure P1. To this end, as illustrated in FIGS. 2A to 2H, the steps S3 to S8 of alignment and progressively bringing the wafers 20 and 30 in contact are carried out in a chamber 110 in which a pressure prevails which may be either equal to or greater than the ambient pressure, or at a pressure less than the ambient pressure but greater than a predetermined pressure threshold value. In the latter case, the chamber comprises partial evacuation means such as a vacuum pump or the like (not represented in FIGS. 2A to 2H).

More precisely, and as explained above, the first pressure P1 is greater than a predetermined pressure threshold value, for example, lying between 20 mbar and 5 mbar, in order to prevent the initiation of the bonding propagation during the steps of mechanical alignment and bringing the wafers in contact. Specifically, from Step S3 onwards, a portion of the bonding face 31 of the wafer 30 lies in contact with the bonding face 21 of the wafer 20. Consequently, from this moment on and if the wafers were to be placed in an environment whose pressure is less than the pressure threshold value, any contacts or shocks applied to the wafers during their handling, in particular during the contact between the pusher and the wafers or when it is retracted so as to make the wafer 30 descend onto the wafer 20, would be liable to cause the initiation of the propagation of a bonding wave.

By resorting to a pressure P1 above the threshold value, at this stage of the method it is possible to avoid triggering the propagation of a bonding wave which could give rise to inhomogeneous deformations in the wafers and subsequent phenomena of misalignment ("overlay"). The pressure P1 of the environment in which the wafers are placed during the steps S1 to S8 may or may not be constant (i.e. potentially it is variable during the steps of alignment and contacting). The initiation of the propagation of the bonding wave may be initiated spontaneously between the wafers 20 and 30 by lowering the pressure P2 in the chamber to a very low value, typically less than 5 mbar.

After the steps of mechanical alignment and bringing the wafers in contact, the molecular adhesion bonding is carried out (Step S9). To this end, the pressure of the chamber 110 is lowered to a second pressure P2 less than the pressure threshold value, namely a pressure typically less than 20 mbar, preferably less than 5 mbar.

Figure 2I:
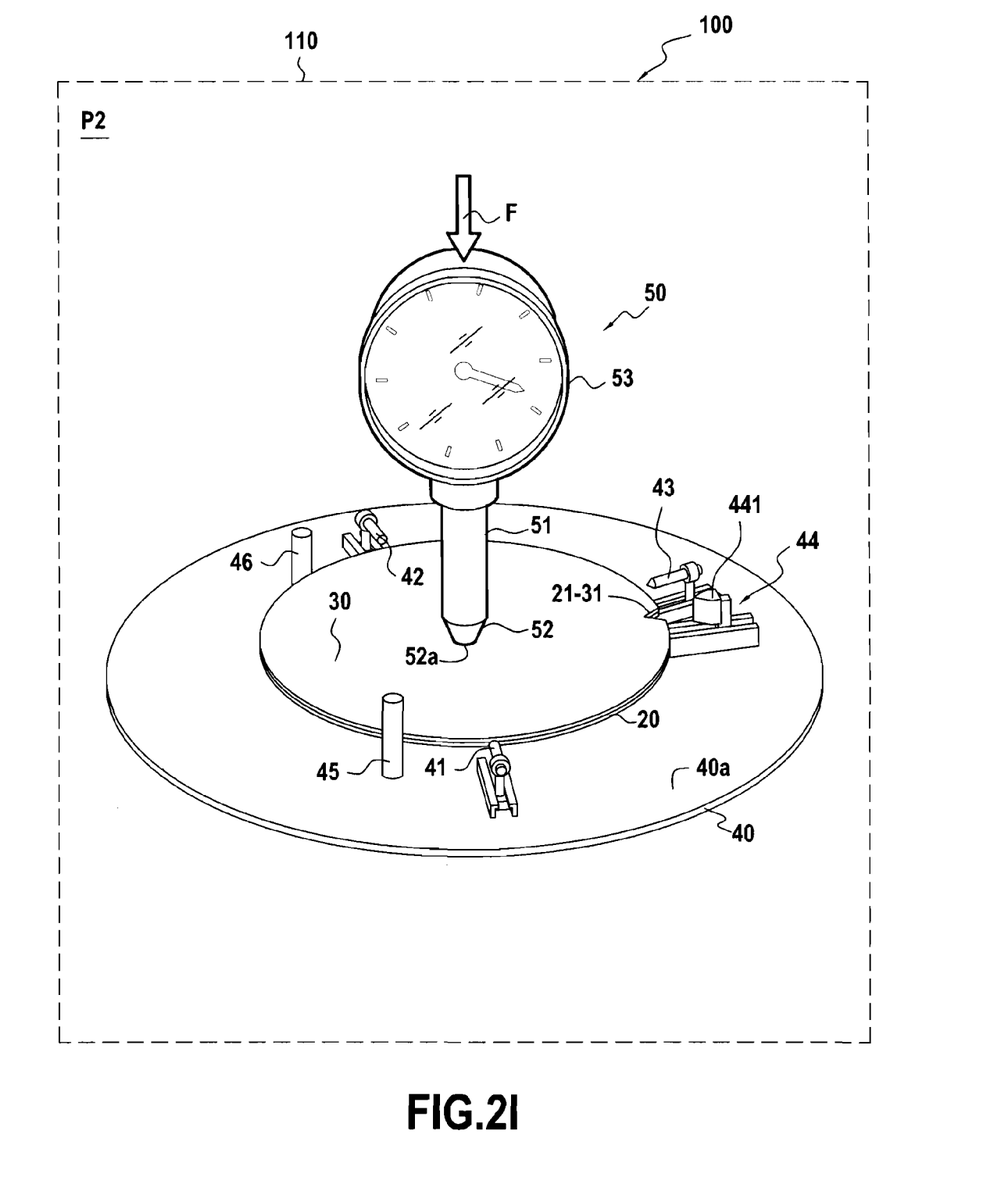

The pressure P2 of the environment in which the wafers are placed during Step S9 may or may not be constant (i.e. potentially it is variable during the initiation step). As illustrated in FIG. 2I, the initiation of the propagation of a bonding wave may alternatively be carried out by means of a tool 50 equipped with a stylet 51 making it possible to apply a mechanical contact point onto the wafer 30. Advantageously, if desired, the mechanical pressure exerted by the stylet 51 onto the wafer 30 may be controlled in order to limit the deformations at the level of the contact point. As illustrated very schematically in FIG. 2I, the tool 50 may comprise a dynamometer 53. The stylet 51 is connected to the dynamometer 53 and comprises a free end 52 with which a mechanical pressure is exerted onto the wafer 30 in order to initiate a contact point between the two wafers 20 and 30. Knowing the value of the area of contact 52a of the tool 50 with the wafer 30, it is possible to apply a mechanical pressure of between 1 MPa and 33.3 MPa by controlling the bearing force F exerted by the tool onto the wafer (bearing force=mechanical pressure×bearing surface). By thus limiting the pressure applied onto one of the two substrates during the initiation of a contact point, the inhomogeneous deformations generated in the wafer are reduced while carrying out molecular adhesion bonding on all of the surfaces of the two wafers in contact. The bearing force exerted by the end 52 onto the wafer 30 is monitored by means of the dynamometer 53.

The bearing element, and more particularly its end intended to come in contact with the wafer, may be made of or covered with a material such as TEFLON®, silicone or a polymer. In general, the end of the bearing element is made or covered with a sufficiently rigid material in order to be able to apply a pressure in a controlled way. Specifically, too flexible a material could deform and lead to an imprecise contact surface and, consequently, to a lack of precision of the applied pressure. Furthermore, too rigid a material could lead to the formation of defects (imprint) on the surface of the wafer.

It is furthermore possible to raise the pressure again in a transient phase between the steps of mechanical alignment and bringing the wafers in contact and the step of initiating the propagation of a bonding wave.

The method of the invention is applicable to the assembling of any type of material compatible with molecular bonding, and in particular semiconductor materials such as silicon or germanium, glass, quartz, sapphire etc. The wafers to be assembled may in particular have a diameter of 100 mm, 150 mm, 200 mm, 300 mm, or 450 mm. The wafers may furthermore comprise microcomponents on the majority of their surface or only on a limited region.

One particular but not exclusive field of the bonding method of the present invention is that of the production of three-dimensional structures.

A method for producing a three-dimensional structure by transferring a layer of microcomponents formed on an initial substrate onto a final substrate, according to another embodiment of the invention, will now be described with reference to FIGS. 3A to 3D and FIG. 4.

Figure 3A:
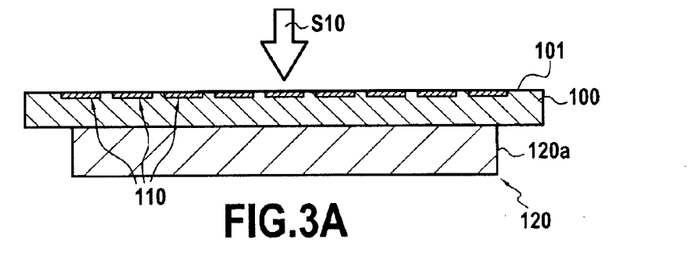
FIGS. 3A to 3D are schematic views showing the production of a three-dimensional structure by using the molecular adhesion bonding method of the present invention.

The production of the three-dimensional structure starts with the formation of a first series of microcomponents 110, which is preferably made of a semiconductor crystalline material, on the surface of an initial wafer or substrate 100 (FIG. 3A, Step S10). The microcomponents 110 may be entire components and/or only a part thereof. The initial substrate 100 may be a monolayer structure, for example a layer of silicon, or a multilayer structure such as a structure of the SOI type. The microcomponents 110 are formed by photolithography by means of a mask making it possible to define the regions for formation of patterns corresponding to the microcomponents 110 to be produced. During the formation of the microcomponents 110 by photolithography, the initial substrate 100 is held on a substrate holder device 120. The substrate holder device comprises a support plate 120a on which the initial substrate 100 is pressed, for example by means of an electrostatic or suction system associated with the support plate 120a.

The face 101 of the initial substrate 100 comprising the microcomponents 110 is then positioned facing and in contact with a face 201 of a final wafer or substrate 200 (Steps S20, FIG. 3B) with a view to bonding by molecular adhesion. According to the invention, the steps S20 of mechanical alignment and bringing the initial substrate 100 into contact on the final substrate 200, such as the steps S3 to S8 described above, are carried out in an enclosure or chamber (not represented in FIG. 6B) in which the pressure is greater than 5 mbar, in order to avoid any initiation of bonding wave propagation during these steps. According to an alternative embodiment, it is the final substrate 200 free of microcomponents which is held by the substrate holder device while the initial substrate 100 is brought on top of the final substrate 200.

Figure 3B:
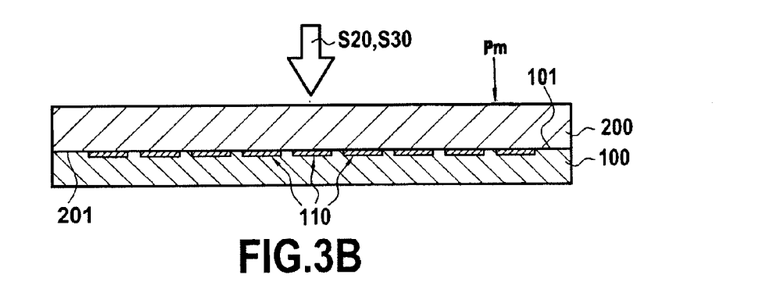

An oxide layer, for example of $SiO_2$, may furthermore be formed on the face 101 of the initial substrate 100 comprising the microcomponents 110 and located at the vicinity of the bonding interface between the initial substrate 100 and the final substrate 200 and/or on the face 201 of the final substrate 200 intended to be bonded to the face 101.

According to the invention, the pressure in the chamber or enclosure (not represented in FIGS. 3A to 3D) containing the aligned substrates 100 and 200 brought in contact with one another is lowered to a value of less than 5 mbar, which, as explained before permit to initiate a spontaneous bonding between the substrate (Step S30, FIG. 3B).

Indeed, in most instances, it has been observed that lowering the pressure in chamber to a value of less than 5 mbar, an preferably less than 3 mbar, initiation of a contact point and propagation of the bonding wave occur spontaneously, that is to say without applying additional mechanical pressure on the wafers. Decreasing the pressure into the chamber or enclosure below 5 mbar was sufficient to spontaneously trigger this initiation. It is currently believed that under these low pressure conditions, the weight of the substrate on the underlying substrate is sufficient to spontaneously initiate the molecular bonding.

In case where the pressure in the chamber is not lowered to less than 5 mbar or to ensure the initiation of a contact point in any case, a contact point may be also initiated between the two substrates by applying a mechanical pressure Pm onto the substrate 200, preferably in proximity to its edge. As indicated above, the pressure Pm may lie between 1 MPa and 33.3 MPa and be applied onto a bearing surface less than or equal to 1 mm$^2$.

The initiation of the contact point leads to the propagation of a bonding wave over the interface between the initial substrate 100 and the final substrate 200. The two substrates are then bonded together by molecular adhesion over their entire surface in contact (bonding interface). A buried layer of microcomponents 110 is thus obtained at the bonding interface between the substrates 100 and 200.

Figure 3C:
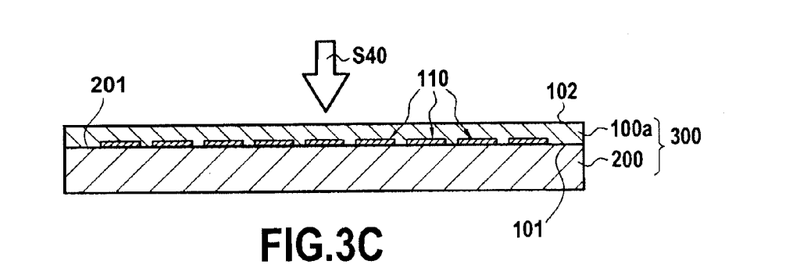

After bonding, and as represented in FIG. 3C, the initial substrate 100 is thinned in order to remove a portion of material present above the first series of microcomponents 110 and to form a layer of semiconductor crystalline material 100a (Step S40). In the event that the substrate 100 is a substrate of the SOI type, the buried insulating layer may advantageously be used in order to delimit the thickness of the remaining layer 100a. A composite structure 300 is then obtained, formed by the final substrate 200 and layer 100a corresponding to the remaining portion of the initial substrate 100. The initial substrate 100 may be thinned in particular by chemical-mechanical polishing (CMP), by chemical etching, or by cleavage or fracture along a weakened plane formed beforehand in the substrate by atom implantation.

Figure 3D:
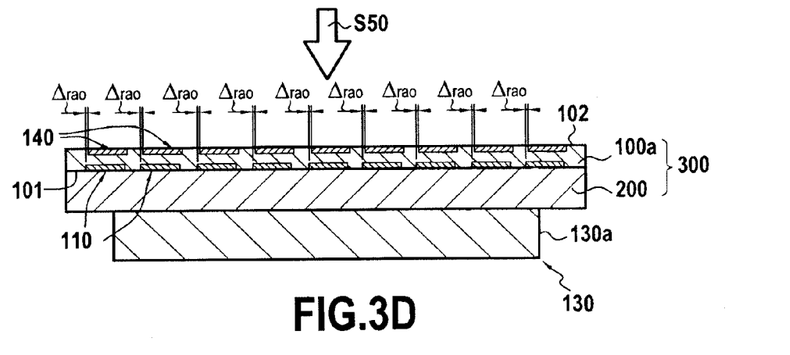
Figure 4:
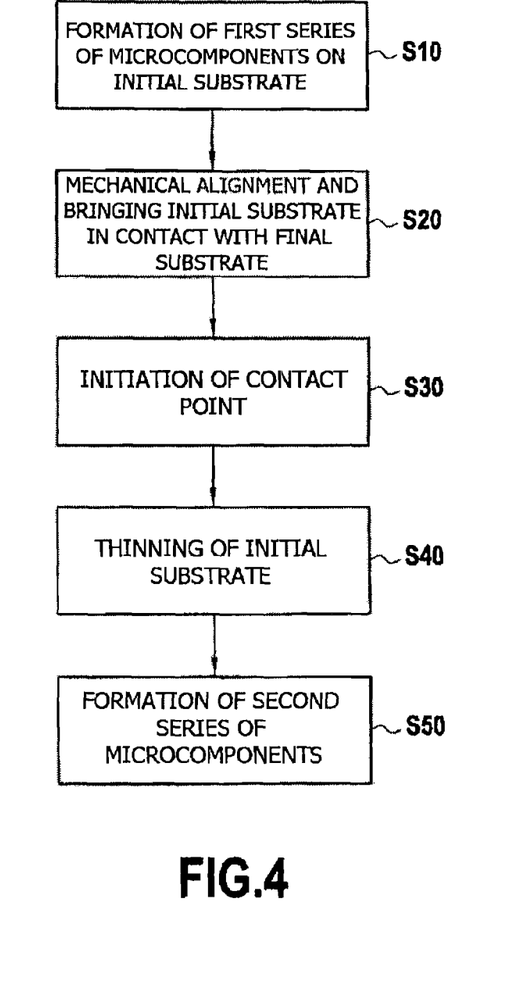
FIG. 4 is a flow chart of the steps carried out during the production of the three-dimensional structure illustrated in FIGS. 3A to 3D.

As represented in FIG. 3D, the next step in the production of the three-dimensional structure consists in forming a second series of microcomponents 140 on the exposed face 102 of the layer 100a (FIG. 3D, Step S50). The microcomponents 140 may correspond to complementary parts of microcomponents 110 in order to form a finished component and/or to separate components intended to function with the microcomponents 140. In order to form the microcomponents 140 in alignment with the buried microcomponents 110, a photolithography mask is used which is similar to that used for forming the microcomponents 110. Just as when forming the microcomponents 110, the composite structure 300 formed by the final substrate 200 and the layer 100a is held on a support plate 130a of a substrate holder device 130 identical to the device 120. The photolithography mask is then applied to the free surface of the layer 100a.

In a variant, the three-dimensional structure is formed by a stack of layers, each layer having been added by the assembly method of the present invention and each layer being in alignment with the directly adjacent layers. In yet another variant, the final substrate 200 itself also comprises microcomponents.

By virtue of the molecular adhesion bonding method of the invention, it has been possible to bond the initial substrate 100 onto the final substrate without deformation or at the very least with a reduction of the deformations such that significant residual alignment offsets of the microcomponents 110 are no longer observed before and after transfer of the initial substrate 100 onto the final substrate 200. It is thus possible to limit the residual offsets to values of less than 100 nm, homogeneously over the entire surface of the wafer. In the particular example of FIG. 3 the initial substrate 100 comprising the first series of microcomponents 110 on its face 101 is first positioned on a bonding support. Then a final wafer or substrate 200 is positioned on the initial substrate 100, its face 201 facing and contacting the face 101 of substrate 100. Spontaneous bonding, that is to say without application of an additional mechanical pressure, that has been observed while the pressure is reduced to a value less than 5 mbar, or preferably less than 3 mbar, leads to limit the residual alignments offsets Δrao between the aligned pair of microcomponents of the first and second series of microcomponents 110 and 140 to values of less than 100 nm homogeneously over the entire surface of the wafer, and to value less than 50 nm over at least 50% of the surface of the wafer.

The microcomponents 140, even if they are of very small sizes (for example <1 µm), can then be formed easily in alignment with the microcomponents 110, even after transfer of the initial substrate. This makes it possible, for example, to interconnect with one another the microcomponents existing in two layers, or on two separate faces of the same layer, by means of metallic connections while minimizing the risks of bad interconnection.

The bonding method of the present invention consequently makes it possible to limit the phenomena of inhomogeneous deformations of the wafers during their molecular bonding at low pressure. In the particular case in which the wafers comprise microcomponents, the method in the end makes it possible to eliminate the phenomenon of misalignment ("overlay") during the transfer of one circuit layer onto another layer or onto a support substrate, and to produce multilayer semiconductor wafers of very high quality.

What is claimed is:

1. A method for bonding at least a first wafer and a second wafer by molecular adhesion, which comprises:
    placing the first and second wafers in an environment having a first pressure (P1) greater than a predetermined threshold pressure above which initiation of a bonding wave propagation is prevented, and then bringing the first wafer and the second wafer into alignment and contact; and
    spontaneously initiating the propagation of a bonding wave between the first and second wafers after the wafers are in contact solely by reducing the pressure within the environment to a second pressure (P2) below the threshold pressure.

2. The method according to claim 1, wherein the predetermined threshold pressure is between 20 millibar and 5 millibar.

3. The method according to claim 1, which further comprises aligning the wafers before initiating the propagation of the bonding wave.

4. The method according to claim 3, wherein the wafers are aligned by applying a force to an edge of one of the wafers.

5. The method according to claim 3, which further comprises arranging the first wafer and the second wafer such that the surfaces to be brought into contact are facing one another, while interposing spacer elements to maintain a space between the two wafers before aligning the wafers.

6. The method according to claim 4, wherein the lateral force is applied to the edges of the wafers by a pusher that moves from a retracted position to an alignment position.

7. The method according to claim 1, which further comprises: interposing spacer elements between the wafers to maintain the space between them; and aligning the wafers before initiating the propagation of the bonding wave.

8. The method according to claim 1, wherein the second pressure (P2) is less than 1 mbar.

9. The method according to claim 1, wherein the first wafer and the second wafer have alignment marks that interact with a holding finger, and further wherein the lateral force is exerted to place the wafers in abutment against at least the holding finger interacting with the alignment marks.

10. The method according to claim 1, which further comprises thinning the first wafer after bonding to form a thin layer.

11. The method according to claim 10, which further comprises producing a second layer of microcomponents on the face of the first wafer opposite the face having the first layer of microcomponents prior to bonding the first and second wafers.

12. The method according to claim 10, wherein the first substrate is a silicon-on-insulator structure.

13. The method according to claim 10, wherein at least the first layer of microcomponents on the first wafer are image sensors.

14. The method according to claim 11, which further comprises forming an oxide layer on the face of the first substrate comprising the first series of microcomponents prior to bonding of the first and second substrates.

\* \* \* \* \*